US 9,508,450 B2

United States Patent
Qing et al.

(10) Patent No.: US 9,508,450 B2
(45) Date of Patent: Nov. 29, 2016

(54) SHIFT REGISTER UNIT, SHIFT REGISTER AND DISPLAY APPARATUS

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventors: Haigang Qing, Beijing (CN); Xiaojing Qi, Beijing (CN); Leisen Nie, Beijing (CN)

(73) Assignees: BOE Technology Group Co., Ltd., Beijing (CN); Chengdu BOE Optoelectronics Technology Co., Ltd., Chengdu (CN)

( * ) Notice: Subject to any disclaimer, the term of this patent is extended or adjusted under 35 U.S.C. 154(b) by 92 days.

(21) Appl. No.: 14/367,035
(22) PCT Filed: Jun. 7, 2013
(86) PCT No.: PCT/CN2013/076954
§ 371 (c)(1),
(2) Date: Jun. 19, 2014
(87) PCT Pub. No.: WO2014/161229
PCT Pub. Date: Oct. 9, 2014

(65) Prior Publication Data
US 2015/0036784 A1  Feb. 5, 2015

(30) Foreign Application Priority Data
Apr. 1, 2013 (CN) .......................... 2013 1 0111066

(51) Int. Cl.
G11C 19/00 (2006.01)
G11C 19/28 (2006.01)
G11C 19/18 (2006.01)
G09G 3/32 (2016.01)

(52) U.S. Cl.
CPC ........... *G11C 19/285* (2013.01); *G09G 3/3208* (2013.01); *G09G 3/3233* (2013.01); *G11C 19/184* (2013.01); *G11C 19/28* (2013.01); *G09G 2310/0286* (2013.01)

(58) Field of Classification Search
None
See application file for complete search history.

(56) References Cited

U.S. PATENT DOCUMENTS 7,289,593 B2 * 10/2007 Tobita .................... G11C 19/28
377/64
8,098,227 B2 * 1/2012 Lee ....................... G09G 3/3677
145/100

(Continued)

OTHER PUBLICATIONS

Oct. 6, 2010—International Preliminary Report on Patentability Appn PCTCN2013076954.

*Primary Examiner* — Tuan T Lam
(74) *Attorney, Agent, or Firm* — Banner & Witcoff, Ltd.

(57) ABSTRACT

A shift register unit, a shift register and a display apparatus, insulate a start charging capacitor from the gate of the driving transistor, and adopt a dual pulling-down structure for the gate of the driving transistor and the output terminal simultaneously thereby the transistor can be turned off normally and a leakage is prevented. The shift register unit comprises: a driving transistor (T1); a first capacitor (C1) for storing an electrical signal from a previous stage; an output pulling-up module (400) connected with a drain of the driving transistor (T1); a drive output terminal (OUT (N)) connected with a source of the driving transistor (T1); a carry signal output terminal connected with a gate of the driving transistor (T1) or the drive output terminal (OUT (N)); an output pulling-down module (100) connected with a source of the driving transistor (T1); a first pulling-down module (200), which is connected with the gate of the driving transistor (T1) through a pulling-up node (PU) and connected with the output pulling-down module (100) through a pulling-down node (PD); and an insulation pulling-up module (300) connected between the pulling-up node (PU) and the first capacitor (C1).

20 Claims, 10 Drawing Sheets

(56) References Cited

U.S. PATENT DOCUMENTS 8,553,026 B2 * 10/2013 Park .................. G09G 3/83266
 345/212

2014/0111413 A1 * 4/2014 Chen ..................... G11C 19/28
 345/100
2014/0355732 A1 * 12/2014 Lin ........................ G11C 19/28
 377/64

* cited by examiner

SHIFT REGISTER UNIT, SHIFT REGISTER AND DISPLAY APPARATUS

CROSS REFERENCE TO RELATED APPLICATIONS

This application is based on International Application No. PCT/CN2013/076954 filed on Jun. 7, 2013, which claims priority to Chinese National Application No. 201310111066.3 filed on Apr. 1, 2013. The entire contents of each and every foregoing application are incorporated herein by reference.

TECHNICAL FIELD

The present disclosure relates to a field of organic light-emitting display, and particularly to a shift register unit, a shift register and a display apparatus.

BACKGROUND

With the development of panel display, a display with high resolution and narrow frame has been a trend, and integration of a gate driving circuit on a panel is a most important solution in order to realize the display with the high resolution and narrow frame. With respect to an a-si (amorphous silicon) technique and a p-si (poly-silicon) technique, various existing mature shift register circuits may achieve this object very well. An oxide TFT (transistor), as a very potential semiconductor technique, has a lower cost as compared with the p-si technique and a higher mobility as compared with the a-si technique, and therefore has been paid more and more attention, it may likely become a mainstream technique of a backboard driving for a flexible display such as an OLED (Organic Light-Emitting Diode) in future. However, the oxide TFT is a depletion transistor, while the aforementioned a-si TFT and p-si TFT are enhancement transistors.

FIG. 1 is a circuit diagram of a traditional basic shift register unit. As illustrated in FIG. 1, the basic shift register unit comprises a pulling-up thin film transistor, a pulling-down thin film transistor, a first capacitor C1, a pulling-up control thin film transistor T100, a pulling-down control thin film transistor T200, a second capacitor C2, a first clock signal input terminal CK, a second clock signal input terminal CKB, an input terminal Input, a reset terminal Reset and an output terminal Output;

a pulling-up (PU) node is a node connected with a gate of the pulling-up thin film transistor, and a pulling-down (PD) node is a node connected with a gate of the pulling-down thin film transistor; and a start signal STV is input from the input terminal Input, VGL is a low level.

FIG. 2 is a timing diagram of respective signals when the basic shift register unit shown in FIG. 1 operates, in which VGH is a high level.

When a circuit of the basic shift register unit is made by an enhancement TFT technique, the circuit of the basic shift register unit may operate normally, as illustrated in solid-line parts in FIG. 2; while if the circuit is made by the oxide transistors (the depletion transistors), the circuit is disabled because a pulling-down transistor can not be turned off. It can be found from the timing graphs for the PU node and the output Output that the case of being not turned off exists.

Differences between the enhancement transistor and the depletion transistor are as illustrated in FIGS. 3 and 4. Herein, FIG. 3 is a characteristic graph of the enhancement transistor, a vertical axis in FIG. 3 denotes drain current iD of the enhancement transistor while a horizontal axis in FIG. 3 denotes gate-source voltage Vgs of the enhancement transistor, and it can be seen from the FIG. 3 that iD is zero when Vgs is zero, which indicates that the enhancement transistor is turned off completely as the Vgs is zero. FIG. 4 is a characteristic graph of the depletion transistor, similarly a vertical axis in FIG. 4 denotes drain current iD of the depletion transistor while a horizontal axis in FIG. 4 denotes gate-source voltage Vgs of the depletion transistor, but FIG. 4 shows that iD is much greater than zero when Vgs is zero, and iD would be zero only when the gate-source voltage Vgs is −6V. Therefore, the depletion transistor is still in a turned-on state and can not be turned off when the gate-source voltage Vgs is 0, such that the existing circuit which may operate normally with the a-si technique or the p-si technique has a large leakage current because the oxide transistor can not be turned off when it is made by the oxide transistor. As a result, the circuit of the traditional basic shift register unit as illustrated in FIG. 1 is not applicable any more.

SUMMARY

In order to solve the problems in the prior art, embodiments of the present disclosure provide a shift register unit, a shift register and a display apparatus, which may settle a problem of affecting the shift register caused by the leakage current of the depletion TFT.

The embodiments of the present disclosure provide a shift register unit, comprising:

a driving transistor;

a first capacitor for storing an electrical signal from a previous stage;

an output pulling-up module, which is connected with a drain of the driving transistor and used for pulling up the drain of the driving transistor to a high level;

a drive output terminal connected with a source of the driving transistor;

a carry signal output terminal, which is connected with a gate of the driving transistor or the drive output terminal and used for outputting an electrical signal to a next stage;

an output pulling-down module, which is connected with a source of the driving transistor and used for pulling down the source of the driving transistor to a second level;

a first pulling-down module, which is connected with the gate of the driving transistor through a pulling-up node, connected with the output pulling-down module through a pulling-down node, and used for pulling down the pulling-up node to the second level or a first level, the pulling-up node being a connection node of the first pulling-down module and the gate of the driving transistor, and the pulling-down node being a connection node of the first pulling-up module and the output pulling-down module; and an insulation pulling-up module, which is connected between the pulling-up node and the first capacitor and used for pulling up the pulling-up node to the high level.

The embodiments of the present disclosure further provide a shift register comprising a plurality of stages of the shift register units.

The embodiments of the present disclosure further provide a display apparatus comprising the shift register described above.

The shift register unit according to the embodiments of the present disclosure insulates a start charging capacitor from the gate of the driving transistor, adopts a dual pulling-down structure for the gate of the driving transistor and the output terminal simultaneously, and utilizes two different pulling-down levels, in which, in a non-operation state, the gate of the driving transistor is pulled down to the second level or the first level lower than the second level and the source of the driving transistor is pulled down to the second level, so that the transistor may be turned off normally and a leakage may be avoided.

DETAILED DESCRIPTION

In order to set forth the solutions and advantages in the embodiments of the present disclosure more clearly, the present disclosure would be described in details below in connection with the drawings and detailed implementations.

The embodiments of the present disclosure provide a shift register unit, a shift register and a display apparatus, in order to settle a problem of affecting the shift register caused by the leakage current of the depletion TFT.

Figure 5:
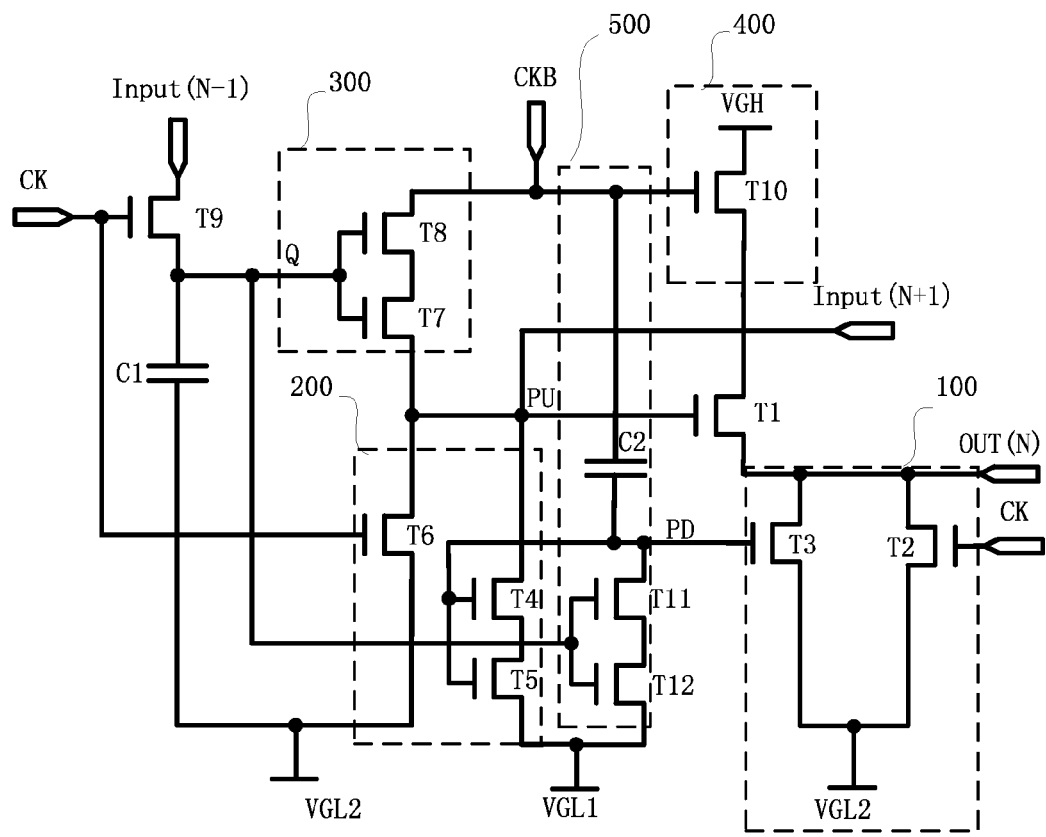
FIG. 5 is a circuit diagram of a shift register unit according to a first embodiment of the present disclosure.

FIG. 5 is a circuit diagram of a shift register unit according to a first embodiment among the embodiments of the present disclosure, as illustrated in FIG. 5, the shift register unit comprises:

a driving transistor T1;

a first capacitor C1 for storing an electrical signal from the previous stage;

an output pulling-up module 400, which is connected with a drain of the driving transistor T1 and used for pulling up the drain of the driving transistor Ti to a high level VGH;

a drive output terminal OUT (N) connected with a source of the driving transistor T1;

a carry signal output terminal, which is connected with the gate of the driving transistor T1 or the drive output terminal and used for outputting an electrical signal to the next stage;

an output pulling-down module 100, which is connected with a source of the driving transistor T1 and used for pulling-down the source of the driving transistor T1 to a second level VGL2;

a first pulling-down module 200, which is connected with the gate of the driving transistor T1 through a pulling-up node PU and is connected with the output pulling-down module 100 through a pulling-down node PD, and is used for pulling down the pulling-up node PU to the second level VGL2 or a first level VGL1; and an insulation pulling-up module 300, which is connected between the pulling-up node PU and the first capacitor C1 and used for pulling up the pulling-up node PU to the high level VGH.

The shift register unit according to the embodiments of the present disclosure insulates a start charging capacitor from the gate of the driving transistor, adopts a dual pulling-down structure for the gate of the driving transistor and the output terminal simultaneously, and utilizes two different pulling-down levels, in which, in a non-operation state, the gate of the driving transistor is pulled down to the second level or the first level and the source of the driving transistor is pulled down to the second level, so that the transistor may be turned off normally and a leakage may be avoided.

Among pulling-down levels according to the embodiments of the present disclosure, the second level VGL2 is greater than the first level VGL1 and a relationship is satisfied: VGL2-VGL1>|Vth|, where Vth is a threshold voltage of a transistor. When the VGL1 is applied to a gate of a TFT and the VGL2 is applied to a source of the TFT, for a depletion transistor, a condition of Vgs<-|Vth| is satisfied, therefore it is realized that the transistor is turned off normally. The embodiments of the present disclosure design the transistors in accordance with the above principle, which ensures that the driving transistor can be turned off normally and the leakage of the driving transistor is avoided.

Referring back to FIG. 5, the output pulling-down module 100 according to the present embodiment comprises a second transistor T2 and a third transistor T3, in which a gate of the second transistor T2 receives a first clock signal CK, a source thereof is connected with the second level VGL2, and a drain thereof is connected with the source of the driving transistor T1; a gate of the third transistor T3 is connected to the pulling-down node PD, a source thereof is connected to the second level VGL2, and a drain thereof is connected with the source of the driving transistor T1. In the present embodiment, with the operations of the second transistor T2 and the third transistor T3, the source of the driving transistor T1 is pulled down to the second level VGL2 in a non-operation state, and is stopped being pulled down in an operation state. Furthermore, by connecting the first clock signal CK to the gate of the second transistor T2, the second transistor T2 may be controlled to be turned on or off. The present embodiment realizes that the drive output terminal OUT (N) is at the second level VGL2 in the non-operation state with the second transistor T2 and the third transistor T3.

The shift register unit according to the embodiments of the present disclosure further comprises a second pulling-down module 500, which is connected with the output pulling-down module 100 through the pulling-down node PD and used for pulling down the pulling-down node PD to the first level VGL1 in the operation state. The second pulling-down module according to the embodiments of the present disclosure may be a transistor or a plurality of transistors connected in series, or also may be composed of transistors and capacitors which are connected in series, and is used for pulling down the gate of the third transistor T3 to the first level VGL1 and turning on the third transistor T3. The second pulling-down module 500 according to the present embodiment comprises an eleventh transistor T11, a twelfth transistor T12 and a second capacitor C2, in which gates of the eleventh transistor T11 and the twelfth transistor T12 are connected with the first capacitor C1, a drain of the eleventh transistor T11 is connected with the pulling-down node PD, a source of the eleventh transistor T11 is connected with a drain of the twelfth transistor T12, a source of the twelfth transistor T12 is connected with the first level VGL1, one terminal of the second capacitor C1 is connected to the pulling-down node PD, and the other terminal receives a second clock signal CKB.

The first pulling-down module 200 according to the embodiments of the present disclosure is used for pulling down the pulling-up node PU to the second level VGL2 or the first level VGL1. Referring back to FIG. 5, the first pulling-down module 200 according to the present embodiment comprises a fourth transistor T4, a fifth transistor T5 and a sixth transistor T6, in which gates of the fourth transistor T4 and the fifth transistor T5 are connected to the pulling-down node PD, a source of the fourth transistor T4 is connected with a drain of the fifth transistor T5, a source of the fifth transistor T5 is to with the first level VGL1, and a drain of the fourth transistor T4 is connected to the pulling-up node PU; a gate of the sixth transistor T6 receives the first clock signal CK, a source thereof is connected to the second level VGL2, and a drain thereof is connected to the pulling-up node PU. The transistors T4, T5 are connected in series in the present embodiment, which increases a resistance as compared with a case of a single transistor and may decrease a pulling-down current at the pulling-up node PU. Of course, the two transistors connected in series may also be transistors more than two in the embodiments of the present disclosure, and adopting a plurality of (more than two) transistors connected in series may further increase the resistance and decrease the pulling-down current at the pulling-up node PU.

The first capacitor C1 in the embodiments of the present disclosure is used for storing a start electrical signal, and it receives a start electrical signal STV if the shift register unit is in a first stage while receives an electrical signal from the previous stage if the shift register unit is in a medium stage. The first capacitor C1 is connected with the gate of the driving transistor T1 through the insulation pulling-up module 300, and is used for insulating a storage capacitor from the driving transistor to prevent the transistor from outputting without being turned off. The insulation pulling-up module 300 according to the embodiments of the present disclosure is connected with one terminal of the first capacitor C1 through an insulation node Q, another terminal of the insulation pulling-up module 300 is connected with the pulling-up node PU, and the other terminal of the first capacitor C1 is connected to the second level VGL2.

Referring back to FIG. 5, the insulation pulling-up module 300 according to the present embodiment comprises a seventh transistor T7 and an eighth transistor T8, in which gates of the seventh transistor T7 and the eighth transistor T8 are connected with the first capacitor C1 through the insulation node Q, a source of the seventh transistor is connected with the pulling-up node PU, and a drain of the seventh transistor T7 is connected with a source of the eighth transistor T8; a drain of the eighth transistor T8 receives the second clock signal CKB. In the non-operation stage, when the second clock signal CKB is at a low level, the pulling-up node PU is pulled down to the second level VGL2, and when the second clock signal CKB is at a high level, the pulling-up node PU is pulled down to the first level VGL1, the driving transistor T1 is turned off so as to prevent the high level from being output via the driving transistor T1. The first capacitor C1 according to the present embodiment receives a carry signal Input(N−1) of the previous stage through a ninth transistor T9, a gate of the ninth transistor T9 receives the first clock signal CK, a drain thereof receives the carry signal Input(N−1) of the previous stage, and a source thereof is connected with the first capacitor C1 and the insulation node Q.

The output pulling-up module 400 according to the embodiments of the present disclosure is used for pulling up the drain of the driving transistor T1 to the high level VGH, and the output pulling-up module 400 according to the present embodiment comprises the second clock signal CKB, and the drain of the driving transistor T1 receives the second clock signal CKB. The output pulling-up module 400 further comprises a tenth transistor T10, in which a gate thereof receives the second clock signal CKB, a drain thereof is connected with the high level, and a source thereof is connected with the drain of the driving transistor T1.

The carry signal output terminal according to the embodiments of the present disclosure is used for outputting the electrical signal to the next stage, and may be connected with the pulling-up node PU or the drive output terminal OUT (N) so as to output the electrical signal to the next stage.

Figure 6:
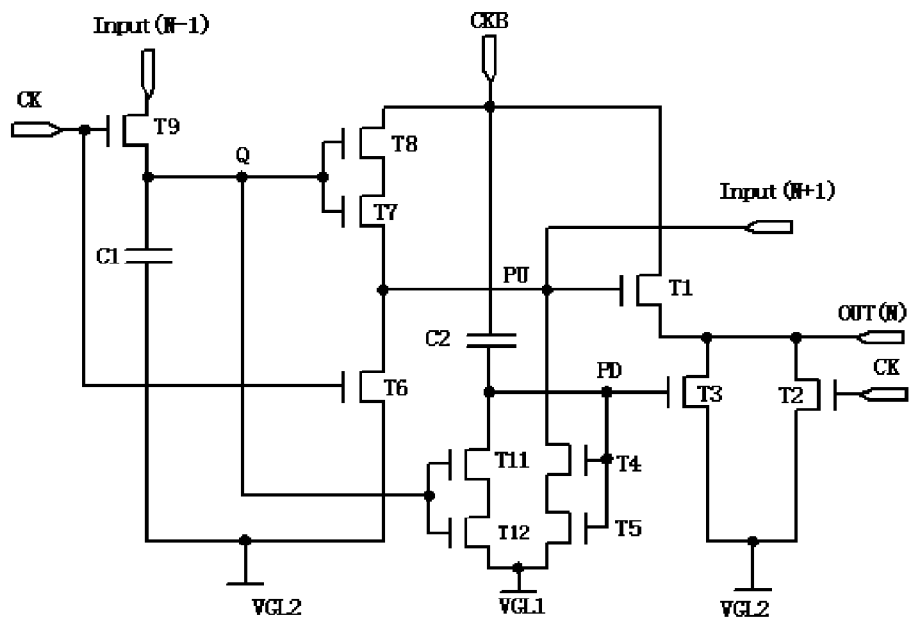
FIG. 6 is a circuit diagram of a shift register unit according to a second embodiment of the present disclosure.

FIG. 6 is a circuit diagram of a shift register unit according to a second embodiment of the present disclosure. As shown in FIG. 6, the circuit according to this embodiment is basically the same as that in the first embodiment, and is only different in that the output pulling-up module only comprises the second clock signal CKB, such that a load of the second clock signal CKB may increase.

Figure 7:
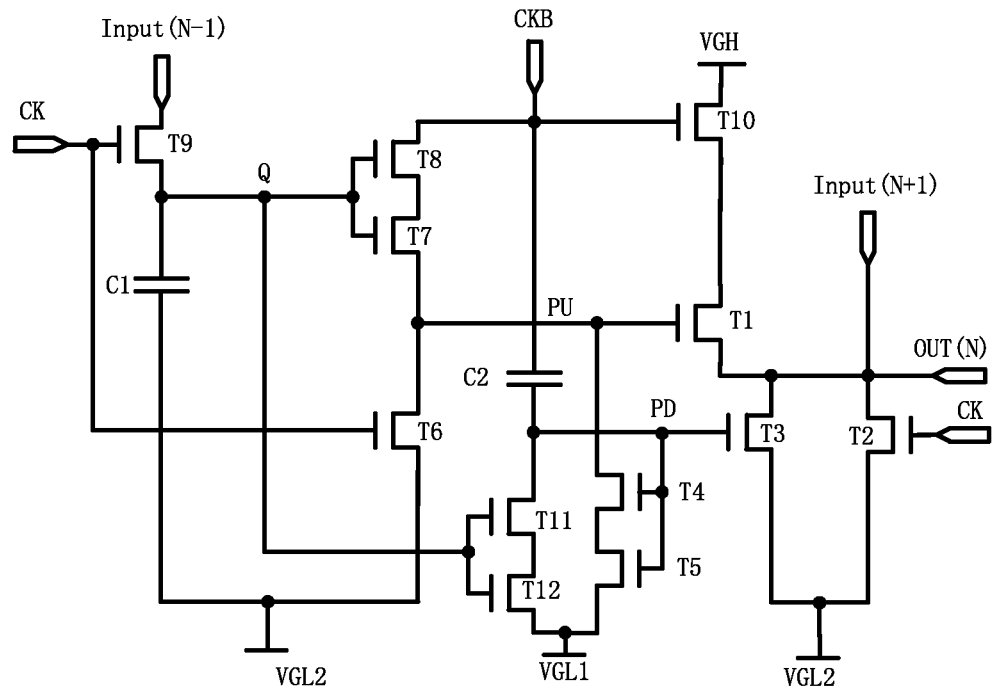
FIG. 7 is a circuit diagram of a shift register unit according to a third embodiment of the present disclosure.

FIG. 7 is a circuit diagram of a shift register unit according to a third embodiment of the present disclosure. As shown in FIG. 7, the circuit diagram in this embodiment is basically the same as that in the first embodiment, and is only different in that the carry signal output terminal is connected with the drive output terminal OUT (N). As a result, a low level at the input terminal might be always maintained at the second level VGL2, and a low level of the insulation node Q may be the second level VGL2 only.

Figure 8:
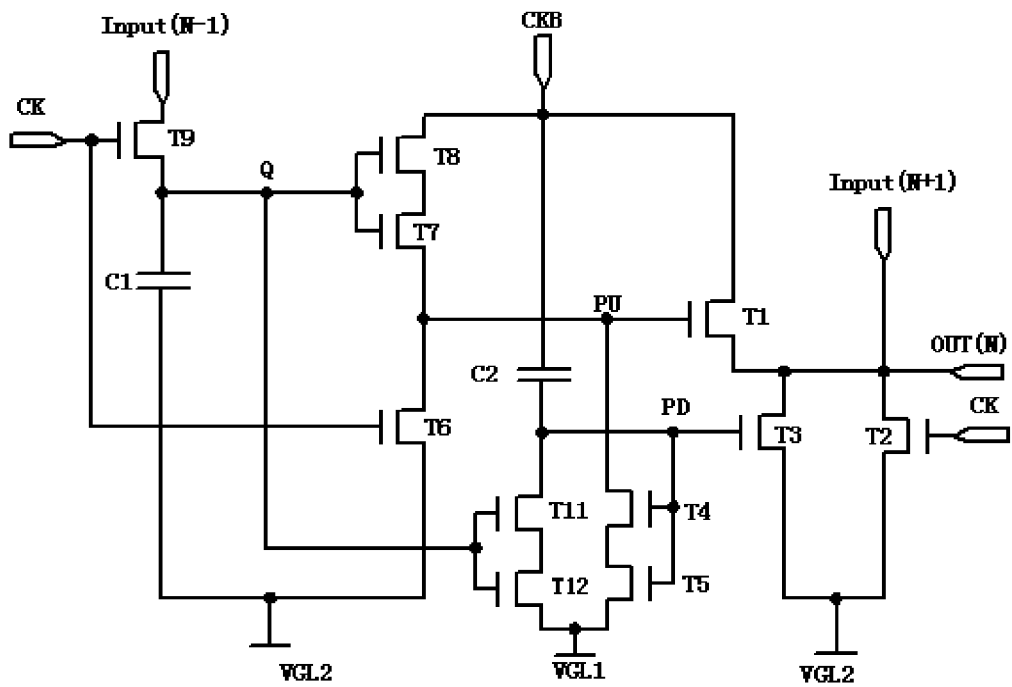
FIG. 8 is a circuit diagram of a shift register unit according to a fourth embodiment of the present disclosure.

FIG. 8 is a circuit diagram of a shift register unit according to a fourth embodiment of the present disclosure. As shown in FIG. 8, the circuit diagram in this embodiment is basically the same as that in the first embodiment, and is different in that the carry signal output terminal is connected with the drive output terminal OUT (N), and the output pulling-up module only comprises the second clock signal CKB, such that the load of the second clock signal CKB may increase, and a low level at the carry signal output terminal might be always maintained at the second level VGL2, while a low level of the insulation node Q may be the second level VGL2 only.

Figure 9:
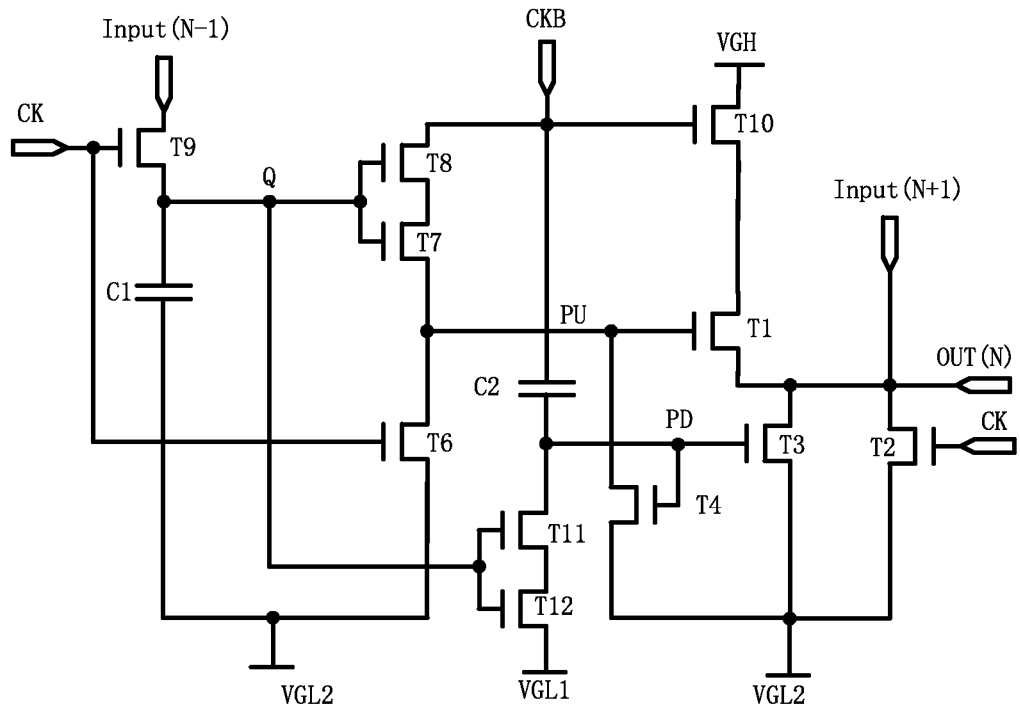
FIG. 9 is a circuit diagram of a shift register unit according to a fifth embodiment of the present disclosure.

FIG. 9 is a circuit diagram of a shift register unit according to a fifth embodiment of the present disclosure. As shown in FIG. 9, the circuit diagram in this embodiment is basically the same as that in the first embodiment, and is only different in that the first pulling-down module 200 comprises a fourth transistor T4, in which a source thereof is connected with the second level VGL2, a gate thereof is connected with the pulling-down node PD, and a drain thereof is connected with the pulling-up node PU. In this embodiment, the carry signal output terminal is connected with the drive output terminal OUT (N).

Figure 10:
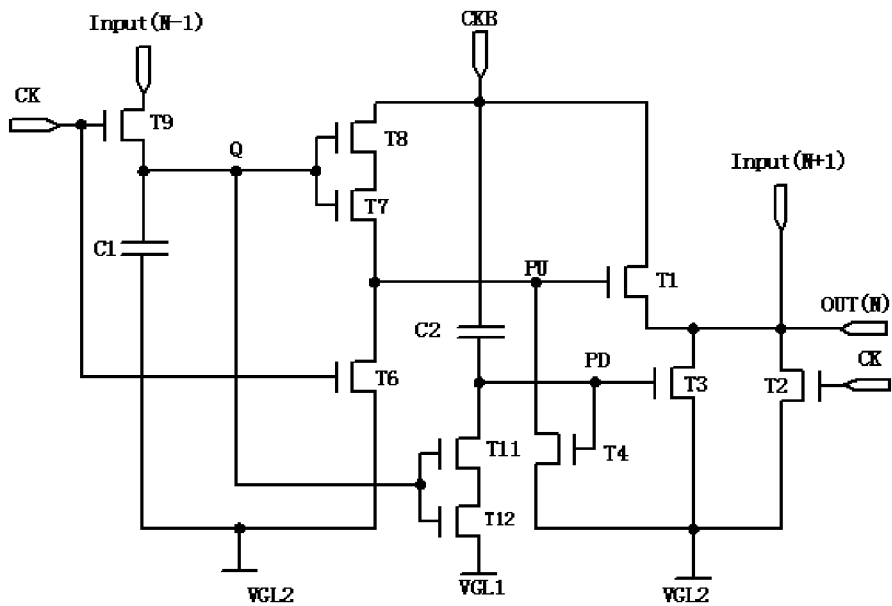
FIG. 10 is a circuit diagram of a shift register unit according to a sixth embodiment of the present disclosure.

FIG. 10 is a circuit diagram of a shift register unit according to a sixth embodiment of the present disclosure. As shown in FIG. 10, the circuit diagram in this embodiment is basically the same as that in the fifth embodiment, and is only different in that the output pulling-up module only comprises the second clock signal CKB, such that a load of the second clock signal CKB may increase.

Figure 11:
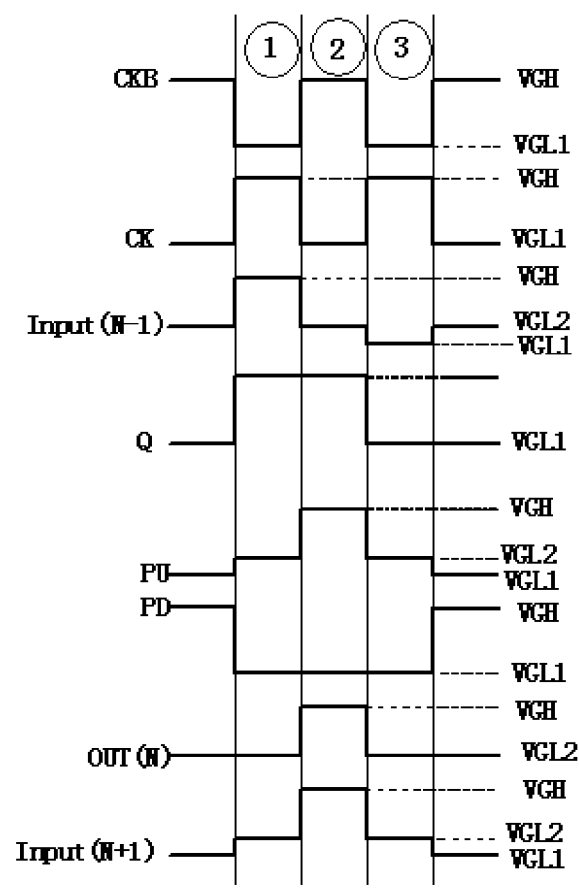
FIG. 11 is a timing chart for the first and second embodiments of the present disclosure.
Figure 12:
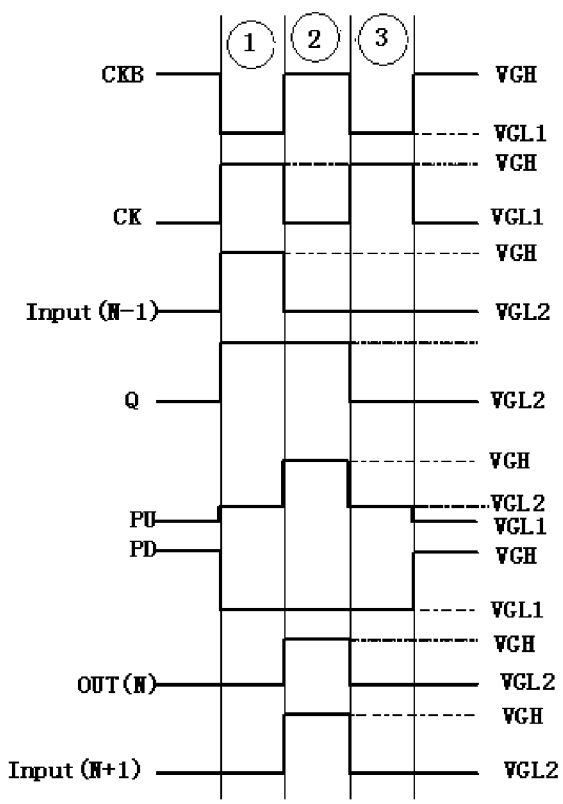
FIG. 12 is a timing chart for the third and fourth embodiments of the present disclosure.
Figure 13:
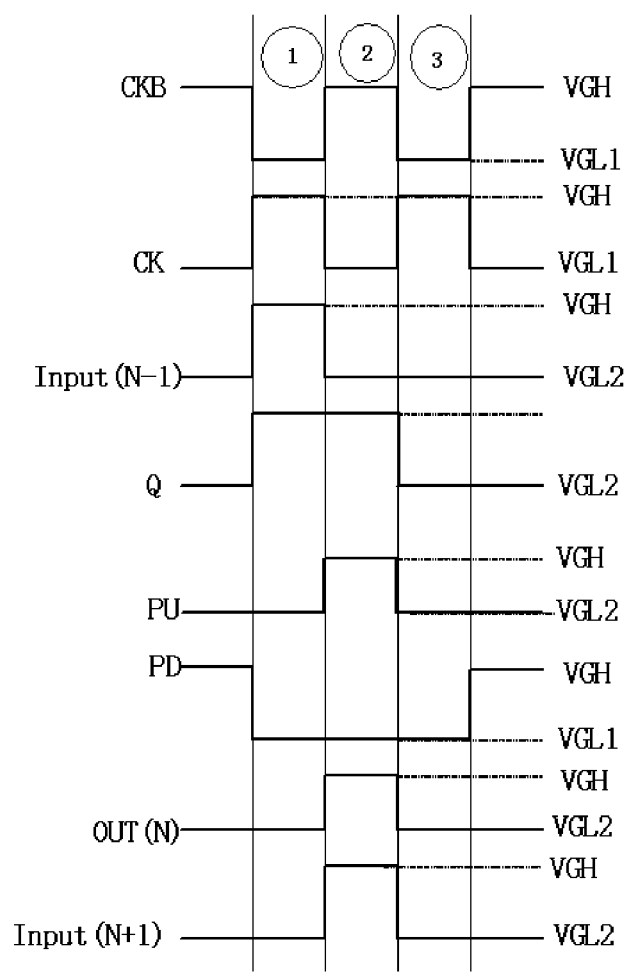
FIG. 13 is a timing chart for the fifth and sixth embodiments of the present disclosure.

FIGS. 11-13 are timing diagrams of the embodiments of the present disclosure, and FIG. 11 is a timing chart for the first and second embodiments of the present disclosure. A common point between the first embodiment and the second embodiment is that both of them provide an output signal Input(N+1) to the next stage from the pulling-up node PU. Because the pulling-down level of the pulling-up node PU in these two embodiments may be pulled down to the first level VGL1 through the T4 and T5, while being pulled down to the second level VGL2 through the sixth transistor T6, and thus the low level at the pulling-up node PU is changed alternatively. Therefore, a low level at the carry signal output terminal is changed alternatively also.

FIG. 12 is a timing chart for the third and fourth embodiments of the present disclosure. A common point between the third embodiment and the fourth embodiment is that both of them provide an output signal Input(N+1) to the next stage from the drive output terminal Therefore, no change occurs in the low potential at the carry signal Input(N−1) and there is only the second level VGL2, but the pulling-down level of the pulling-up node PU in these two embodiments may be pulled down to the first level VGL1 through the T4 and T5, awhile being pulled down to the second level VGL2 through the sixth transistor T6, so that the low level at the pulling-up node PU is changed alternatively.

FIG. 13 is a timing chart for the fifth and sixth embodiments of the present disclosure. A common point between the fifth embodiment and the sixth embodiment is that both of them provide an output signal Input(N+1) to the next stage from the drive output terminal. Therefore, no change occurs in the low level at the carry signal output terminal and there is only the second level VGL2, and the pulling-down level of the pulling-up node PU in these two embodiments is pulled down to the second level VGL2 through the fourth transistor T4, while being pulled down to the second level VGL2 through the sixth transistor T6, so that the low level at the pulling-up node PU is not changed alternatively.

An operation process of the circuit would be explained below in connection with the first embodiment. The operation process of the circuit according to the present embodiment may be divided into three stages as follows.

Stage 1: during this stage, the first clock signal CK and the received carry signal Input(N−1) are at the high level VGH, N is a nature number, the second clock signal CKB is at the low level VGL1, a level at the pulling-down node PD is VGL1, and the second transistor T2, the sixth transistor T6 and the ninth transistor T9 are turned on at this time. When the ninth transistor T9 is turned on, the carry signal Input (N−1) charges the first capacitor C1, and a level at the insulation node Q is charged to the high level VGH at this time, then the seventh transistor T7 and the eighth transistor T8 are turned on. Because the second clock signal CKB is at the first level VGL1, although the T6 is also turned on, the level at the pulling-up node PU is pulled down to the first level VGL1 at this time since the second level VGL2 is greater than the first level VGL1, while the drive output terminal OUT(N) is pulled down to the second level VGL2 because the second transistor T2 is turned on. At this time, a voltage difference between the gate and source of the driving transistor T1 is Vgs<-|Vth|, Vth is the threshold voltage of the transistor, so that the driving transistor T1 is turned off normally; meanwhile, a level at the pulling-down node PD is the first level VGL1, the source of the third transistor T3 is at the second level VGL2, and a voltage difference between the gate and source of the third transistor T3 is Vgs<-|Vth|, so that the third transistor T3 is turned off normally, and the drive output terminal OUT(N) outputs the second level VGL2.

Figure 1:
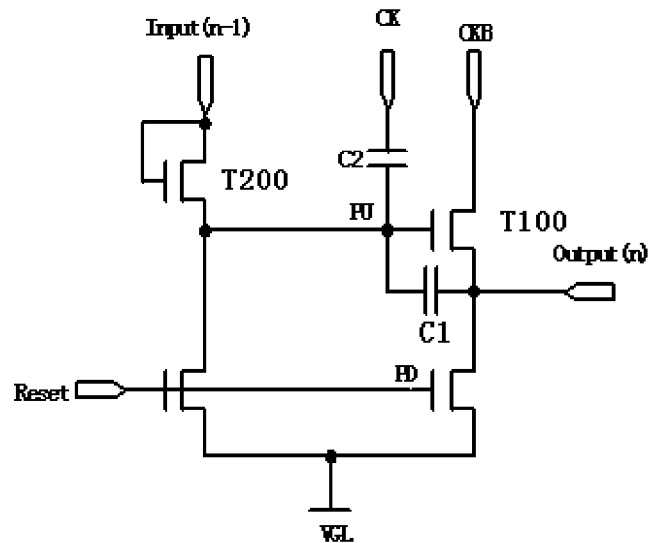
FIG. 1 is a circuit diagram of a conventional basic shift register unit.
Figure 2:
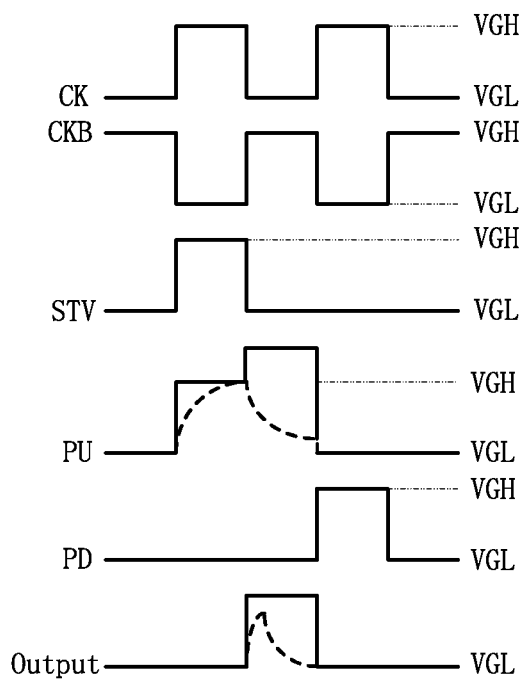
FIG. 2 is a timing diagram of respective signals when the basic shift register unit operates.
Figure 3:
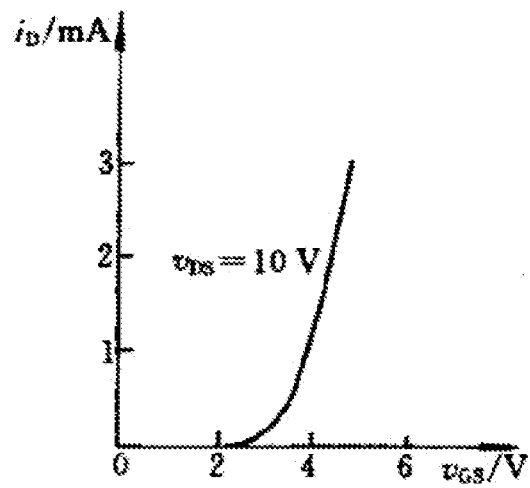
FIG. 3 is a characteristic graph of an enhancement transistor.
Figure 4:
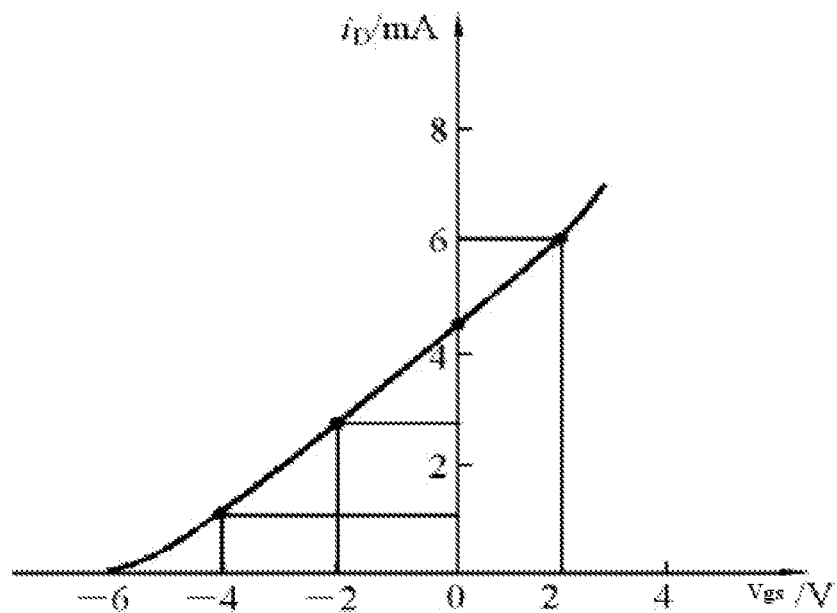
FIG. 4 is a characteristic graph of a depletion transistor.

Stage 2: during this stage, the second clock signal CKB is at the high level VGH, the first clock signal CK is at the first level VGL1, and because the signal of the carry signal input terminal is from a pulling-up node PU of the previous stage, the second clock signal CKB in this stage and the first clock signal CK of the previous stage is in-phase and are all at the high level, thereby the pulling-up node PU of the previous stage is pulled down to the second level VGL2, and a level of the carry signal input terminal in this stage is the second level VGL2, at this time ,the source of the ninth transistor T9 is at the second level VGL2 and the gate thereof is at the first level VGL1, therefore, the sixth transistor T6 is turned off normally. The level at the insulation node Q is still maintained at VGH, the level at the pulling-down node PD is in the first level VGL1, the third transistor T3 is still turned off at this time, the level of the first clock signal CK of the second transistor T2 is the first level VGL1, the source of the second transistor T2 is at the second level VGL2, therefore the second transistor T2 is turned off normally. The high level at the insulation node Q enables the transistors T7 and T8 to be turned on continually, the high level of the second clock signal CKB charges the pulling-up node PU through the transistors T7 and T8. At this time the level at the pulling-down node PD is the first level VGL1, and the source of the fifth transistor T5 is also at the first level VGL1, it can be known from the characteristic curve of the depletion transistor illustrated in FIG. 4 that the fifth transistor T5 is in a linear region, and the fourth transistor T4 is also in the linear region, both are turned on to a certain extent but have certain resistances, and the resistance is larger when both are connected in series. Therefore, pulling-down currents caused by the transistors T4 and T5 with respect to the pulling-up node PU are very small, and the larger load capability of the second clock signal CKB enables the level at the pulling-up node PU to be stabilized at the high level VGH. Thus, the driving transistor T1 is turned on, and the high level VGH is output to the drive output terminal OUT (N) through the driving transistor T1.

Stage 3: during this stage, the second clock signal CKB jumps to the first level VGL1, the tenth transistor T10 is turned off, the first clock signal CK jumps to the high level VGH, the second transistor T2, the sixth transistor T6 and the ninth transistor T9 are turned on, the second transistor T2 is turned on, the drive output terminal OUT(N) is pulled down to the second level VGL2, the sixth transistor T6 is turned on, the pulling-up node PU is pulled down to the second level VGL2. The pulling-up node PU of the previous stage is pulled down to the first level VGL1 because the pulling-down node PD of the previous stage is at the high level, the carry signal input terminal of the current stage is from the level at the pulling-up node PU of the previous stage. At this time, the level at the carry signal input terminal of the current stage is VGL1, the ninth transistor T9 is turned on, the level at the insulation node Q is pulled down to the first level VGL1, so that the seventh transistor T7 and the eighth transistor T8 are turned off. At this time, the level at the pulling-down node PD is still at the first level VGL1, therefore the third transistor T3 is turned off Until now, the operation of one shift register unit is finished and in the next stage, the level at the pulling-down node PD becomes the high level, the third transistor T3 is turned on, and the pulling-up node PU will be pulled down to the first level VGL1, thus the above operation is repeated.

Figure 14:
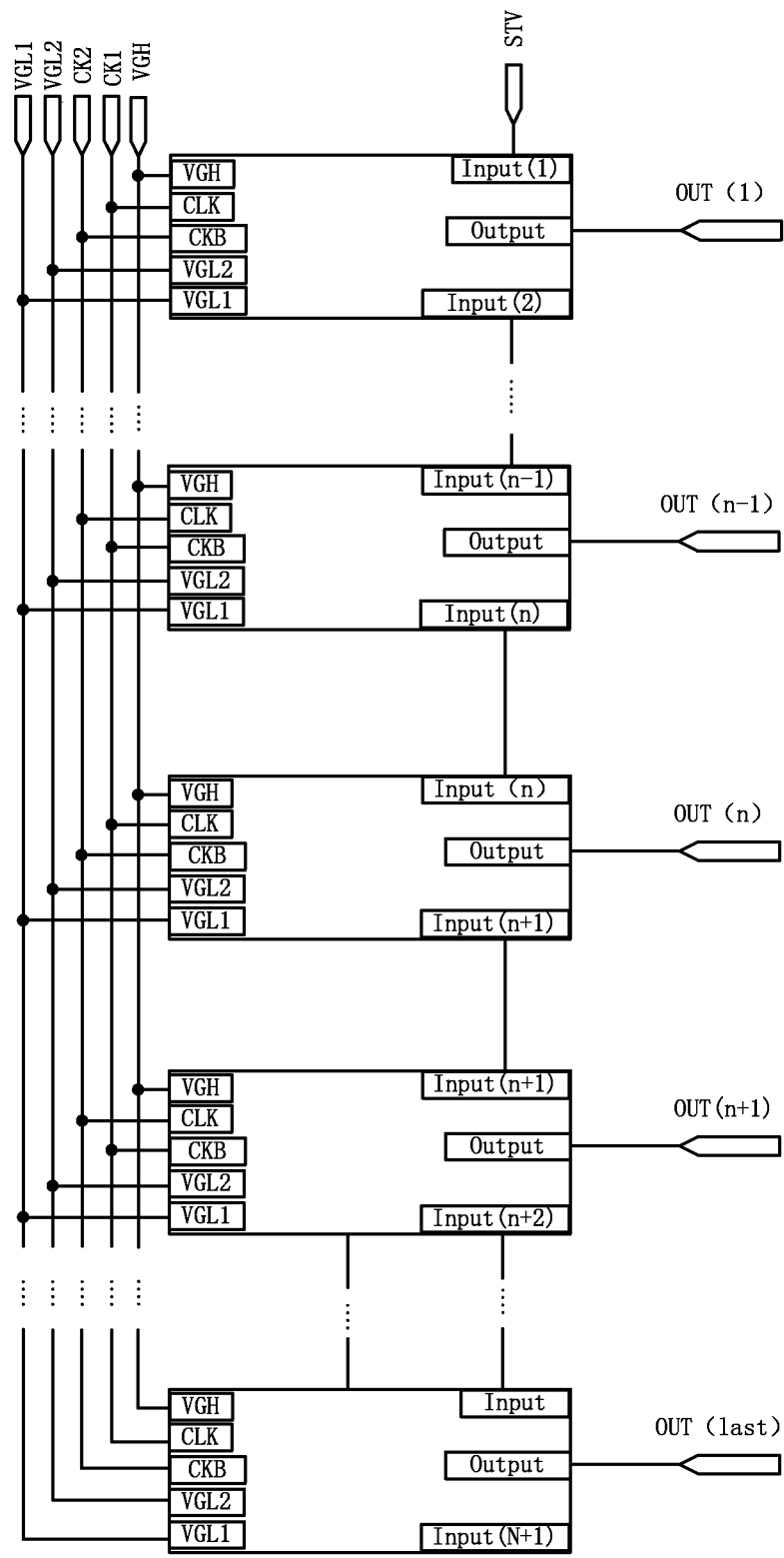
FIG. 14 is a cascade structure view for the first, third and fifth embodiments of the present disclosure.
Figure 15:
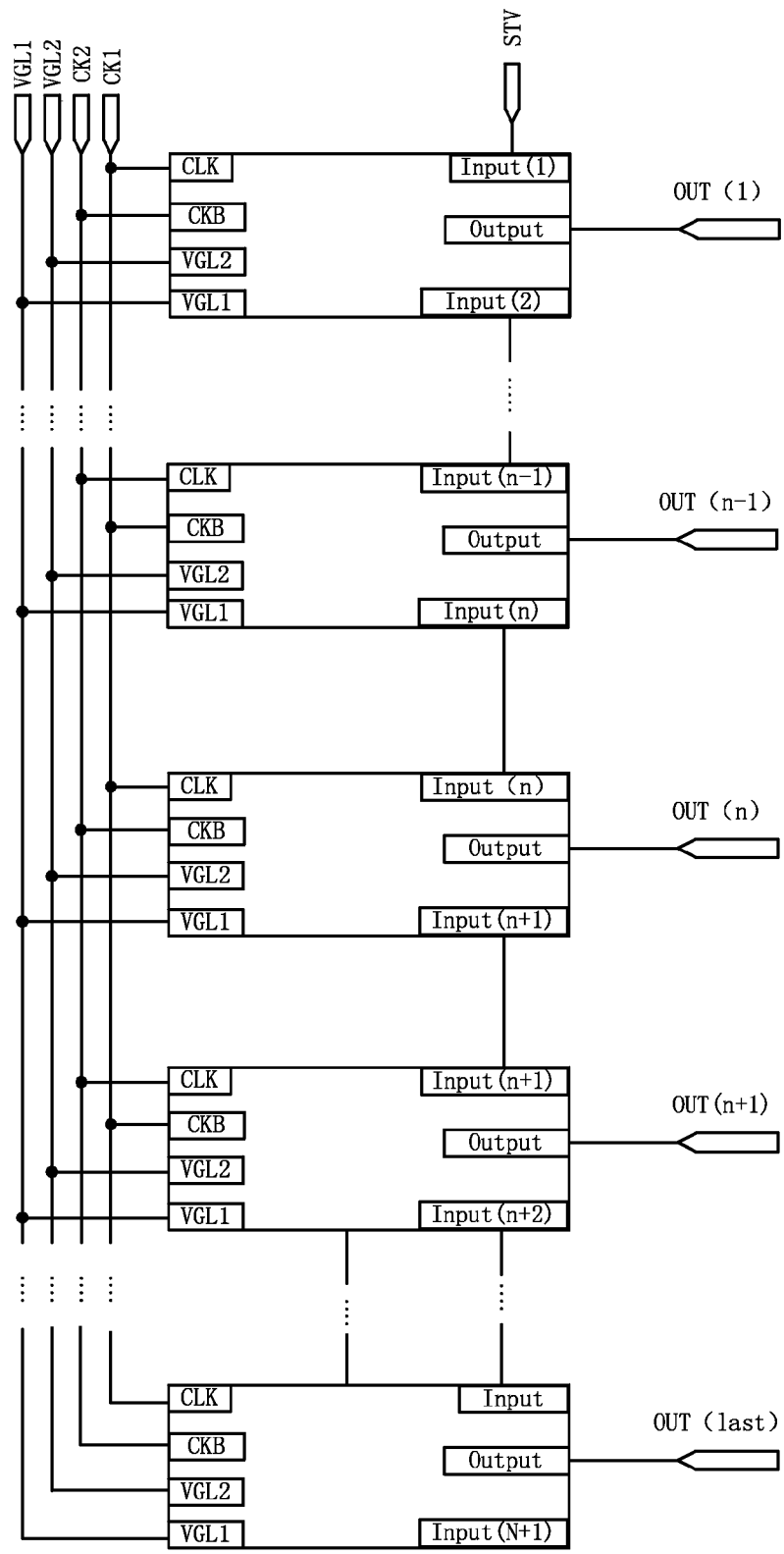
FIG. 15 is a cascade structure view for the second, fourth and sixth embodiments of the present disclosure.

As illustrated in FIGS. 14-15, one implementation of the shift register according to the embodiments of the present disclosure is configured by connecting N stages of the shift register units, in order to serve as a row scanner for an active matrix, where N is generally a number of the rows in the active matrix and is a positive integer;

the phases of a clock signal inputted from a first clock signal input terminal and a clock signal inputted from a second clock signal input terminal are opposite, and their duty ratios are 50%;

wherein an input terminal Input(1) of the first stage of the shift register unit is connected with a start pulse signal STV, and the STV is active at high level;

except for the first stage of the shift register unit, an input terminal of each stage of the shift register units is connected with a carry signal output terminal of the previous stage of the shift register unit;

clock control signals of two adjacent stages of the shift register units are opposite phase, for example: if the clock signal input terminal of the first stage of the shift register unit is connected with the first clock signal CK, a clock signal input terminal of the second stage of the shift register unit, which is adjacent to the first stage of the shift register unit, is connected with the second clock signal CKB, the first clock signal CK and the second clock signal CKB are opposite phase.

The embodiments of the present disclosure further provide a display apparatus comprising the shift register as described in above embodiments of the present disclosure, and the display apparatus may comprises a liquid crystal display apparatus such as a liquid crystal panel, a liquid crystal TV, a mobile phone, a liquid crystal display. Besides the liquid crystal display apparatus, the display apparatus may further comprise an organic light-emitting display or display apparatuses of other types, such as an electric reader, etc. The shift register may be served as a scan circuit or a gate driving circuit in the display apparatus in order to provide a progressive scan function to transfer a scan signal to a display area.

Above descriptions are only illustrative but not limitative for the present invention, and those ordinary skilled in the art may understand that many modifications, variations and equivalences may be made without departing from the spirit and scope of the present invention defined by attached claims, and such modifications, variations and equivalences fall into the scope sought for protection by the present invention.

What is claimed is:

1. A shift register, comprising:
a driving transistor;
a first capacitor for storing an electrical signal from a previous stage;
an output pulling-up module, which is connected with a drain of the driving transistor and used for pulling-up the drain of the driving transistor to a high level;
a drive output terminal connected with a source of the driving transistor;
a carry signal output terminal, which is connected with a gate of the driving transistor or the drive output terminal and used for outputting an electrical signal to a next stage;
an output pulling-down module, which is connected with a source of the driving transistor and used for pulling-down the source of the driving transistor to a second level
a first pulling-down module, which is connected with the gate of the driving transistor through a pulling-up node, connected with the output pulling-down module through a pulling-down node, and used for pulling down the pulling-up node to the second level or a first level, the pulling-up node being a connection node of the first pulling-down module and the gate of the driving transistor, and the pulling-down node being a connection node of the first pulling-down module and the output pulling-down module; and
an insulation pulling-up module, which is connected between the pulling-up node and the first capacitor and used for pulling-up the pulling-up node to the high level.

2. The shift register unit of claim 1, wherein the second level is higher than the first level, and an absolute value of a potential difference between them is greater than an absolute value of a threshold voltage of a transistor.

3. The shift register unit of claim 2, wherein the shift register unit further comprises a second pulling-down module, which is connected with the output pulling-down module through the pulling-down node and used for pulling down the pulling-down node to the first level.

4. The shift register unit of claim 3, wherein the output pulling-down module comprises a second transistor and a third transistor, in which a gate of the second transistor receives a first clock signal, a source thereof is connected with the second level, and a drain thereof is connected with the source of the driving transistor; a gate of the third transistor is connected to the pulling-down node, a source thereof is connected to the second level, and a drain thereof is connected with the source of the driving transistor.

5. The shift register unit of claim 3, wherein first pulling-down module comprises a fourth transistor, a fifth transistor and a sixth transistor, in which gates of the fourth transistor and the fifth transistor are connected with the pulling-down node, a source of the fourth transistor is connected with a drain of the fifth transistor, a source of the fifth transistor is connected to the first level, a drain of the fourth transistor is connected to the pulling-up node; a gate of the sixth transistor receives a first clock signal, a source thereof is connected to the second level, and a drain thereof is connected to the pulling-up node.

6. The shift register unit of claim 3, wherein the second pulling-down module comprises an eleventh transistor, a twelfth transistor and a second capacitor, in which gates of the eleventh transistor and the twelfth transistor are connected with the first capacitor, a drain of the eleventh transistor is connected to the pulling-down node, a source of the eleventh transistor is connected to a drain of the twelfth transistor, a source of the twelfth transistor is connected to the first level, one terminal of the second capacitor is connected to the pulling-down node, and the other terminal receives a second clock signal.

7. The shift register unit of claim 3, wherein the first pulling-down module comprises a fourth transistor and a sixth transistor, in which a gate of the fourth transistor is connected to the pulling-down node, a drain of the fourth transistor is connected to the pulling-up node, and a source of the fourth transistor is connected to the second level; a gate of the sixth transistor receives a first clock signal, a source thereof is connected to the second level, and a drain thereof is connected to the pulling-up node.

8. The shift register unit of claim 1, wherein the insulation pulling-up module comprises a seventh transistor and an eighth transistor, in which gates of the seventh transistor and the eighth transistor are connected with the first capacitor through an insulation pulling-up node, a source of the seventh transistor is connected to the pulling-up node, and a drain of the seventh transistor is connected with a source of the eighth transistor; a drain of the eighth transistor receives a second clock signal.

9. The shift register unit of claim 8, wherein the first capacitor receives a carry signal of the previous stage through a ninth transistor, a gate of the ninth transistor receives a first clock signal, a drain thereof receives the carry signal of the previous stage, and a source thereof is connected to the first capacitor and the insulation pulling-up node.

10. The shift register unit of claim 1, wherein the output pulling-up module comprises the second clock signal and the drain of the driving transistor receives the second clock signal.

11. The shift register unit of claim 10, wherein the output pulling-up module further comprises a tenth transistor, whose gate receives the second clock signal, drain is connected with the high level, and source is connected with the drain of the driving transistor.

12. A shift register comprising a plurality of stages of the shift register units of claim 1, each stage of the shift register units comprises a carry signal input terminal and a carry signal output terminal,
except that the carry signal input terminal of the first stage of the shift register unit is used for receiving a start signal, the carry signal input terminal of other stages of the shift register units is connected with the carry signal output terminal of the previous stage of the shift register unit;
except for the last stage of the shift register unit, the carry signal out terminal of other stages of the shift register units is connected with the carry signal input terminal of the next stage of the shift register unit.

13. A display apparatus comprising the shift register of claim 12.

14. The shift register unit of claim 4, wherein the first pulling-down module comprises a fourth transistor, a fifth transistor and a sixth transistor, in which gates of the fourth transistor and the fifth transistor are connected with the pulling-down node, a source of the fourth transistor is connected with a drain of the fifth transistor, a source of the fifth transistor is connected to the first level, a drain of the fourth transistor is connected to the pulling-up node; a gate of the sixth transistor receives the first clock signal, a source thereof is connected to the second level, and a drain thereof is connected to the pulling-up node.

15. The shift register unit of claim 4, wherein the second pulling-down module comprises an eleventh transistor, a twelfth transistor and a second capacitor, in which gates of the eleventh transistor and the twelfth transistor are connected with the first capacitor, a drain of the eleventh transistor is connected to the pulling-down node, a source of the eleventh transistor is connected to a drain of the twelfth transistor, a source of the twelfth transistor is connected to the first level, one terminal of the second capacitor is connected to the pulling-down node, and the other terminal receives a second clock signal.

16. The shift register unit of claim 4, wherein the first pulling-down module comprises a fourth transistor and a sixth transistor, in which a gate of the fourth transistor is connected to the pulling-down node, a drain of the fourth transistor is connected to the pulling-up node, and a source of the fourth transistor is connected to the second level; a gate of the sixth transistor receives the first clock signal, a source thereof is connected to the second level, and a drain thereof is connected to the pulling-up node.

17. The shift register of claim 12, wherein the shift register unit further comprises a second pulling-down module, which is connected with the output pulling-down module through the pulling-down node and used for pulling down the pulling-down node to the first level.

18. The shift register of claim 17, wherein the output pulling-down module comprises a second transistor and a third transistor, in which a gate of the second transistor receives a first clock signal, a source thereof is connected with the second level, and a drain thereof is connected with the source of the driving transistor; a gate of the third transistor is connected to the pulling-down node, a source thereof is connected to the second level, and a drain thereof is connected with the source of the driving transistor.

19. The shift register of claim 17, wherein the first pulling-down module comprises a fourth transistor, a fifth transistor and a sixth transistor, in which gates of the fourth transistor and the fifth transistor are connected with the pulling-down node, a source of the fourth transistor is connected with a drain of the fifth transistor, a source of the fifth transistor is connected to the first level, a drain of the fourth transistor is connected to the pulling-up node; a gate of the sixth transistor receives a first clock signal, a source thereof is connected to the second level, and a drain thereof is connected to the pulling-up node.

20. The shift register of claim 17, wherein the second pulling-down module comprises an eleventh transistor, a twelfth transistor and a second capacitor, in which gates of the eleventh transistor and the twelfth transistor are connected with the first capacitor, a drain of the eleventh transistor is connected to the pulling-down node, a source of the eleventh transistor is connected to a drain of the twelfth transistor, a source of the twelfth transistor is connected to the first level, one terminal of the second capacitor is connected to the pulling-down node, and the other terminal receives a second clock signal.

* * * * *